United States Patent
Albaugh et al.

(10) Patent No.: US 9,681,559 B2
(45) Date of Patent: Jun. 13, 2017

(54) THICK FILM CIRCUITS WITH CONDUCTIVE COMPONENTS FORMED USING DIFFERENT CONDUCTIVE ELEMENTS AND RELATED METHODS

(71) Applicant: GM GLOBAL TECHNOLOGY OPERATIONS LLC, Detroit, MI (US)

(72) Inventors: Lisa M Albaugh, Frankfort, IN (US); David A Smith, Kokomo, IN (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 368 days.

(21) Appl. No.: 14/135,018

(22) Filed: Dec. 19, 2013

(65) Prior Publication Data

US 2015/0181725 A1    Jun. 25, 2015

(51) Int. Cl.
| | |
|---|---|
| H05K 3/46 | (2006.01) |
| H05K 1/09 | (2006.01) |
| H05K 3/12 | (2006.01) |
| H05K 3/24 | (2006.01) |
| H05K 1/05 | (2006.01) |

(52) U.S. Cl.
CPC ............... *H05K 3/46* (2013.01); *H05K 1/09* (2013.01); *H05K 1/092* (2013.01); *H05K 3/12* (2013.01); *H05K 3/245* (2013.01); *H05K 3/4685* (2013.01); *H05K 1/053* (2013.01); *H05K 2201/10022* (2013.01); *H05K 2203/1126* (2013.01); *H05K 2203/1476* (2013.01); *Y10T 29/49155* (2015.01)

(58) Field of Classification Search
CPC .......... H01G 7/023; H05K 1/053; H05K 1/09; H05K 1/092; H05K 2201/10022; H05K 2203/1126; H05K 2203/1476; H05K 3/12; H05K 3/245; H05K 3/46; H05K 3/4685
USPC ....... 29/529.1, 825, 829, 830, 832, 840, 846
See application file for complete search history.

(56) References Cited

U.S. PATENT DOCUMENTS

| | | | |
|---|---|---|---|
| 4,122,232 A | 10/1978 | Kuo | |
| 4,172,919 A | 10/1979 | Mitchell | |
| 4,322,316 A | 3/1982 | Provance et al. | |
| 4,521,329 A | 6/1985 | Siuta et al. | |
| 4,816,615 A | 3/1989 | Prabhu et al. | |
| 4,830,878 A * | 5/1989 | Kaneko ................. | H01L 27/013 257/E27.115 |
| 4,868,034 A | 9/1989 | Steinberg | |

(Continued)

*Primary Examiner* — Dion R Ferguson
(74) *Attorney, Agent, or Firm* — Phillips Ryther & Winchester; Jared L. Cherry (57) ABSTRACT

Disclosed herein are a variety of embodiments of thick film circuits with conductive components formed using different conductive elements and related methods for forming such circuits. One embodiment consistent with the present disclosure includes a multi-level thick film circuit formed on a substrate and having a first layer disposed on the substrate. The first layer may include a first conductive component formed using a first conductive element. The first conductive element may be a precious metal. The circuit may further include a second layer having a second conductive component. The second conductive component may be formed using a second conductive element. In one embodiment, the second conductive element may be a base metal. At least a portion of the first conductive element may directly contact at least a portion of the second conductive element such that the first layer is in electrical communication with the second layer.

14 Claims, 8 Drawing Sheets

(56) References Cited

U.S. PATENT DOCUMENTS

| | | | |
|---|---|---|---|
| 5,795,794 A * | 8/1998 | Nagano | H01L 28/55 |
| | | | 257/E21.009 |
| 6,207,288 B1 | 3/2001 | Bloom | |
| 7,176,152 B2 | 2/2007 | Brown et al. | |
| 2003/0154592 A1 * | 8/2003 | Felten | H01C 7/003 |
| | | | 29/610.1 |
| 2005/0277550 A1 | 12/2005 | Brown et al. | |
| 2007/0113952 A1 * | 5/2007 | Nair | H01L 23/49883 |
| | | | 156/89.17 |
| 2009/0040010 A1 * | 2/2009 | Djordjevic | H01C 7/003 |
| | | | 338/309 |
| 2011/0049541 A1 * | 3/2011 | Katsuno | H01L 33/405 |
| | | | 257/94 |

* cited by examiner

THICK FILM CIRCUITS WITH CONDUCTIVE COMPONENTS FORMED USING DIFFERENT CONDUCTIVE ELEMENTS AND RELATED METHODS

TECHNICAL FIELD

This disclosure relates to thick film circuits. More particularly, but not exclusively, this disclosure relates to thick film circuits in which different conductive elements are used to form different components. In one particular embodiment, a conductive component formed using silver may be in direct electrical communication with a conductive component formed using copper.

BACKGROUND

Thick film circuits may be formed using an additive process in which successive layers of materials are disposed on an electrically insulating substrate. Thick film conductive elements can be formed, for example, by screen printing a thick film conductive ink that is formulated with a powdered base metal onto a non-conductive substrate. The thick film conductive ink may then be dried and fired to sinter or fuse the powdered base metal and other remaining constituents to the substrate. The substrate may be processed (e.g., scribing, profiling, drilling, dicing, etc.) either before, during, or after an additive process used to form a thick film circuit.

The conductive inks may be used to form electrodes, resistors, terminals, and other features of the circuit. The function of the circuit may be determined by a design printed onto the substrate and a combination of features included on the circuit. The circuit may be further designed with termination pads for attaching semiconductor chips, connector leads, capacitors, and the like.

Thick film circuits have conventionally been fabricated using precious metals as the primary conductive element. The high cost of precious metals contributes significantly to the cost of creating thick film and hybrid circuits using thick film production techniques. Although base metals have a lower cost, a variety of factors has previously presented challenges to utilizing such metals in thick film circuits, specifically multilevel circuits.

The inventors of the present disclosure have recognized that potential benefits may be achieved by using base metals in thick film circuits that have traditionally been formed using precious metals.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of any disclosed method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations.

Various embodiments of the present disclosure comprise thick film circuits having conductive components formed using different conductive elements. As used herein, the term conductive element is not specifically limited to a particular element of the periodic table. Rather, a conductive element may also refer to alloys and other composites including multiple elements from the periodic table. Further, all materials include impurities, and a conductive element, as the term is used herein, does not require any specific level of purity. A variety of conductive elements known to those skilled in the art may be used in thick film circuits to produce conductive components in various embodiments consistent with the present disclosure.

Thick film circuits have wide application in the automotive industry and other industries. In the automotive industry, for example, thick film circuits may be used in inverters, converters, sensors (e.g., fuel/air mixture sensors, pressure sensors, engine and gearbox control sensors, airbags sensors, etc.), and the like. Such circuits may offer high reliability and the ability to operate in large temperature ranges.

Hybrid circuits are multilevel interconnected circuits consisting of a semiconductor or integrated circuit chip mounted on a ceramic insulator substrate. Hybrid circuits may be built in three-dimensional structures by employing multiple layers of electrical components. Dielectric insulating layers are placed between conductor layers to permit the conductors to cross over one another. The insulated overlapping conductor layers are interconnected through vias formed through the insulating layers and filled with conductor material. The vias are holes formed in individual insulator layers and which are filled with a conductive metal paste. Multilevel circuits may be formed in a plurality of steps. For example, one step may involve the formation of a conductive component and a subsequent step may involve the formation of an insulating layer on top of the conductive component.

To reduce the cost of thick film and hybrid circuits, copper may be used in place of silver for conductive traces, heat sinks, ground planes, etc. In some cases, silver is used to facilitate multilayer or cross-over applications because insulating materials (e.g., a dielectric) may be disposed on top of silver, but difficulties may arise where insulating materials are disposed on top of or underneath base metals, such as copper.

Precious metal conductor pastes may be prepared using a variety of metals, such as gold, silver, platinum, palladium, iridium, rhodium, ruthenium, and osmium, and combinations of such metals. Resistor paste materials are prepared from a variety of substances such as carbon, thallium, indium, ruthenium, and the like. Dielectric paste materials are prepared from materials such as glasses, ceramics, glazes and ferro-electric materials.

One or more firing processes may be used to fix the layers permanently on the substrate. The firing processes may sinter or fuse the inorganic constituents to bond the printed film to the substrate. The presence of an oxidizing atmosphere (i.e., air) during the firing process may promote the sintering and bonding processes which occur between the thick film and the substrate. The presence of an oxidizing atmosphere also serves to oxidize and remove the carbon-based components present in the paste.

Base metals, such as copper, are oxidized in an air atmosphere during a firing step, and thus an inert or neutral atmosphere, such as nitrogen, may be employed during firing. An appreciable quantity of oxygen in the firing step may cause oxidation of the copper, which in turn may adversely affect the electrical characteristics and soldering properties of the conductor because of the formation of copper oxide coatings. Accordingly, forming thick film circuits having conductive components formed using different conductive elements has presented challenges. Moreover, different conductive elements may require different firing temperatures to achieve desired properties and to avoid leaching.

One particular embodiment of the present disclosure may be used in connection with electrical inverters and converters used in automobiles. Such applications may require high electrical and thermal conductivity, together with high reliability. Such circuits may incorporate cross-over features, where conductive elements are disposed in multiple layers of a circuit and separated by one or more layers of insulating materials. As discussed above, such a circuit may be formed using multiple steps in which a variety of features of the thick film circuit are created. Silver and silver alloys may be used to form the conductive elements in such a circuit. Use of silver and silver alloys as the conductive element may provide excellent electrical and thermal properties; however, the cost of silver is significant in comparison to other conductive elements, such as copper. Consistent with the present disclosure, copper may be substituted for silver to achieve cost savings associated with the lower cost of copper in comparison to the cost of silver.

Figure 1A:
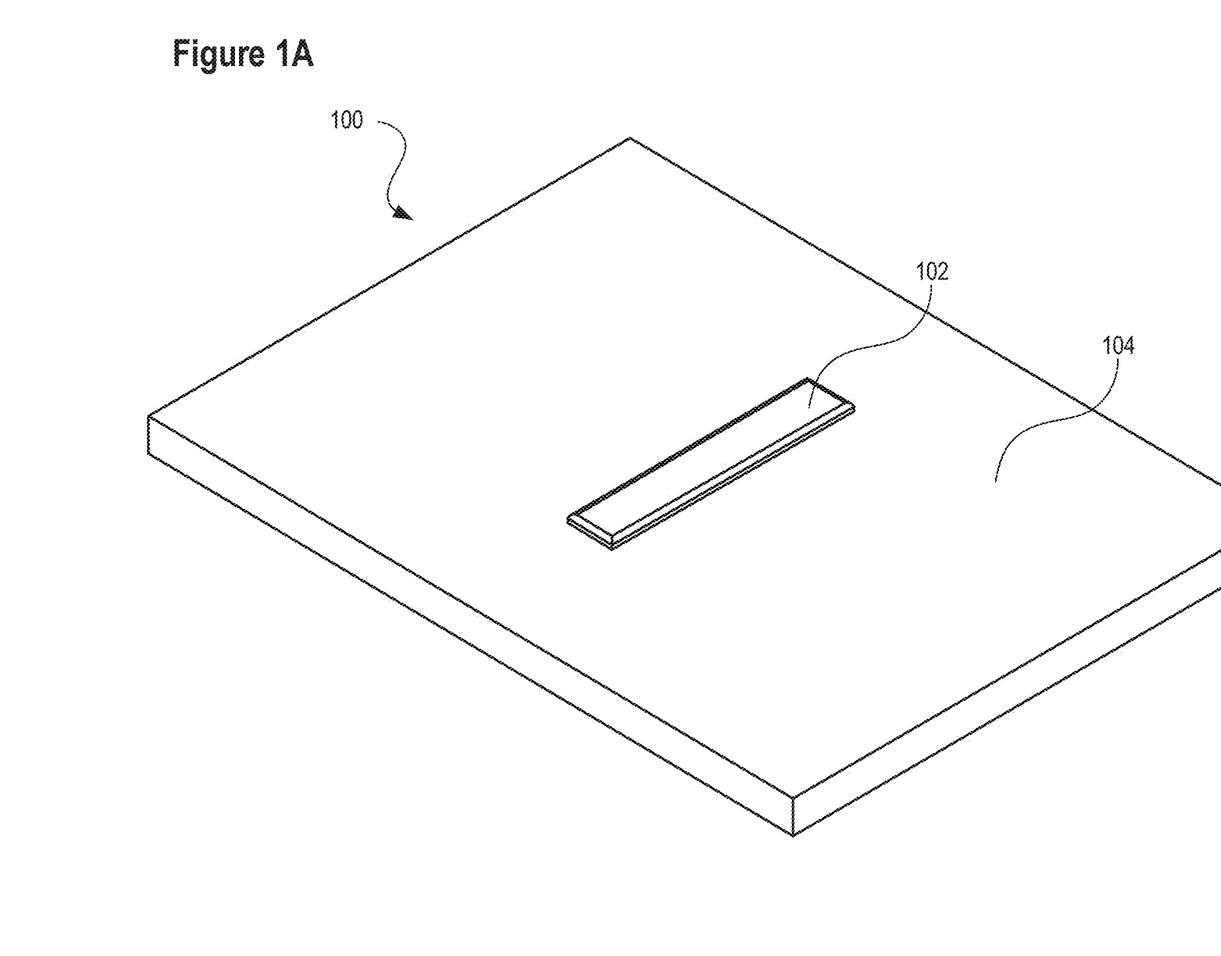
FIG. 1A illustrates a perspective view of a first conductive layer of a thick film circuit with a first conductive element formed using a first conductive material on a substrate consistent with certain embodiments of the present disclosure.

FIG. 1A illustrates perspective view of a first conductive layer of a thick film circuit 100 with a conductive component 102 formed using a first conductive element on a substrate 104 consistent with one embodiment of the present disclosure. In one embodiment, the substrate 104 may be prepared prior to the formation of the conductive component 102 on the substrate 104. The preparation may include, for example, scribing, profiling, drilling holes, and/or dicing. According to some embodiments, the substrate 104 may comprise alumina, although other suitable materials are also contemplated.

Figure 1B:
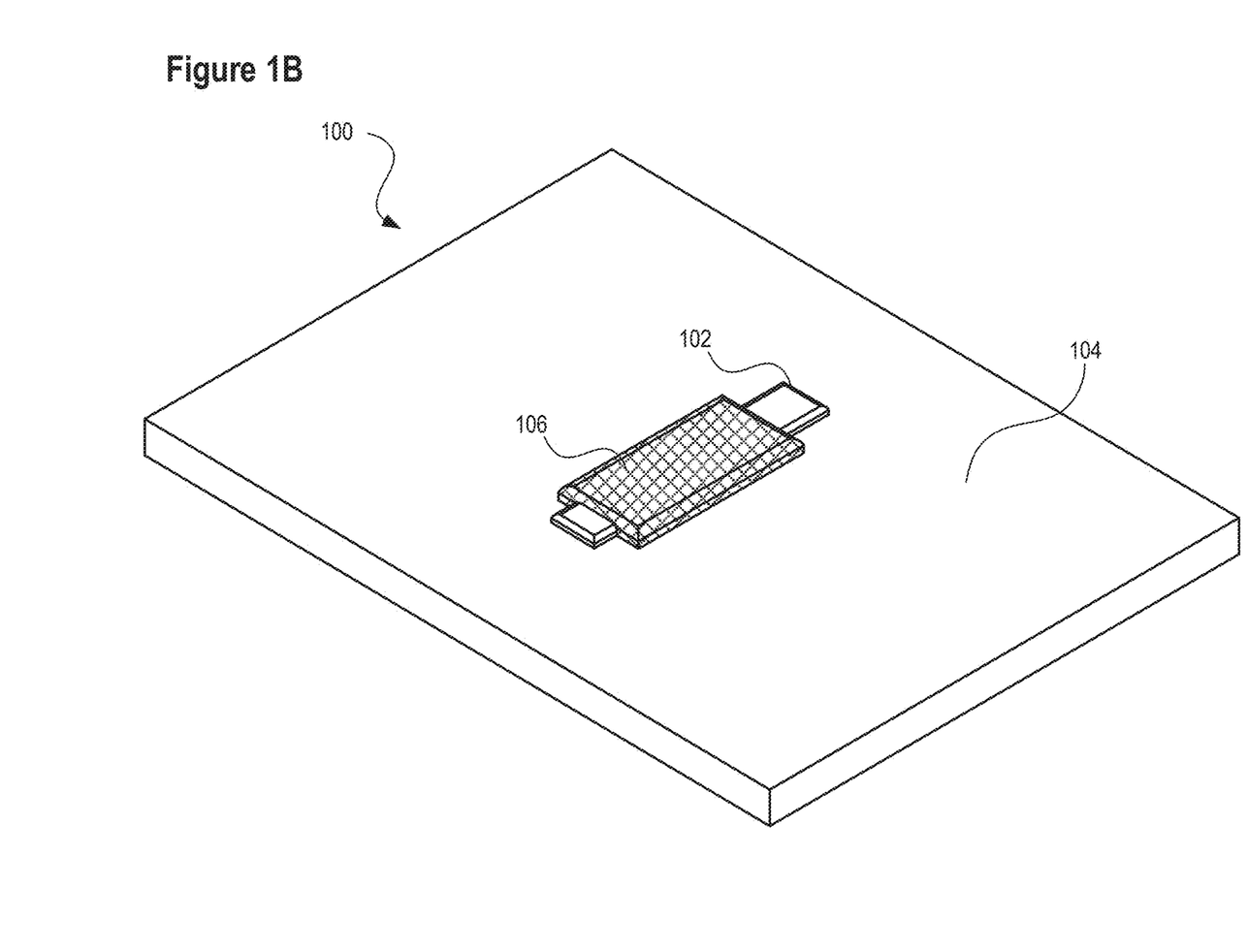
FIG. 1B illustrates a perspective view of a dielectric layer disposed on top of the first conductive element of the circuit shown in FIG. 1A consistent with certain embodiments of the present disclosure.

FIG. 1B illustrates a perspective view of a dielectric layer 106 disposed on top of conductive component 102 of the circuit 100 shown in FIG. 1A consistent with one embodiment of the present disclosure. The dielectric layer 106 may be formed using a variety of materials. The dielectric layer 106 may separate conductive component 102 from other conductive components that may be subsequently formed.

Figure 1C:
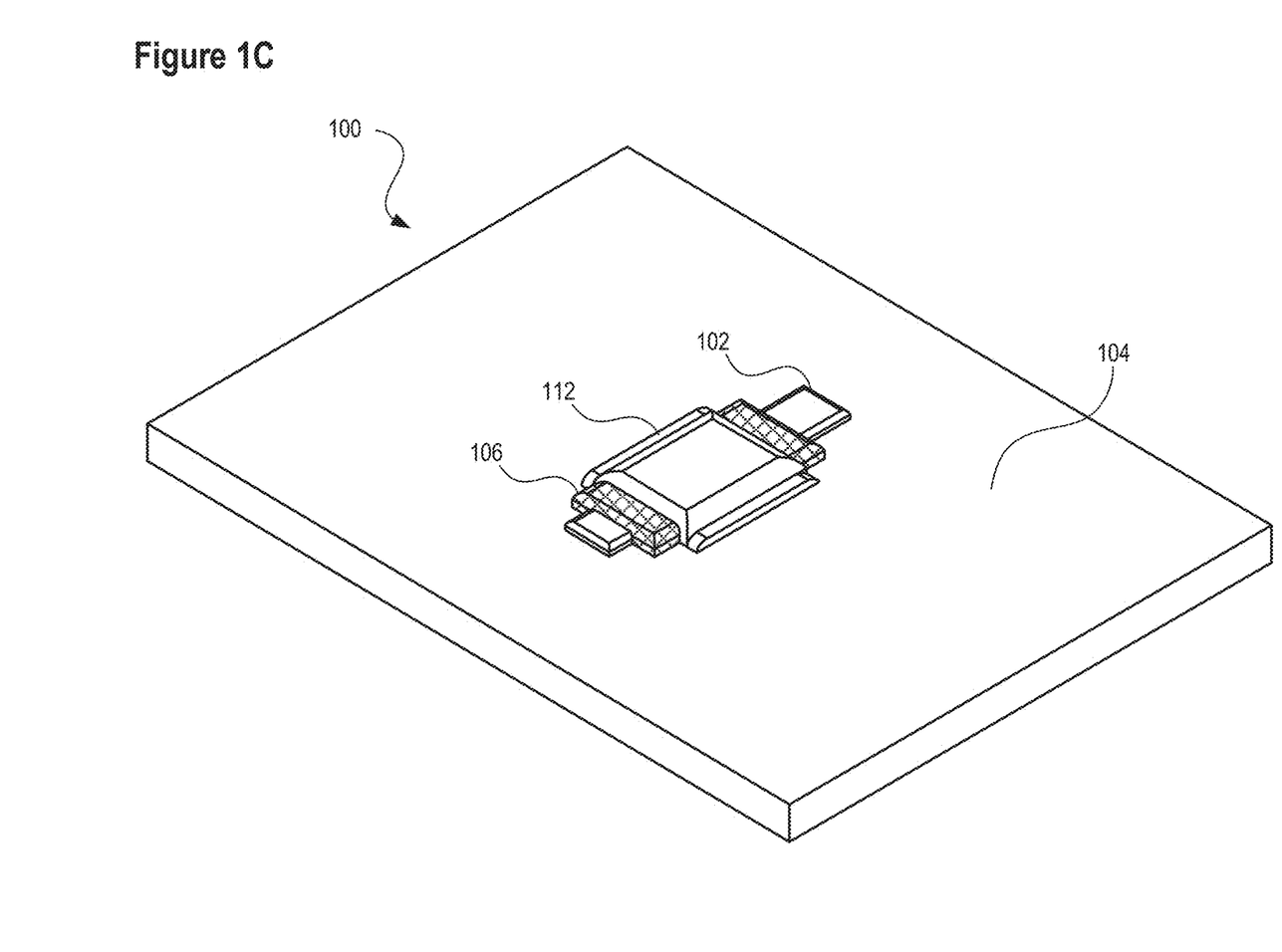
FIG. 1C illustrates a perspective view of a second conductive component formed using the first conductive element and disposed at least partially on top of the dielectric layer of the circuit shown in FIG. 1B consistent with certain embodiments of the present disclosure.

FIG. 1C illustrates a perspective view of a conductive component 112 formed using conductive element 102 and disposed at least partially on top of the dielectric layer 106 of the circuit 100 shown in FIG. 1B consistent with certain embodiments of the present disclosure. As illustrated in FIG. 1C, the dielectric layer 106 electrically isolates conductive component 102 from conductive component 112. In one particular embodiment, conductive component 112 may be formed using silver. In this embodiment, the circuit including conductive component 112 may be fired in an atmosphere containing oxygen at a temperature of approximately 850° C.

Figure 1D:
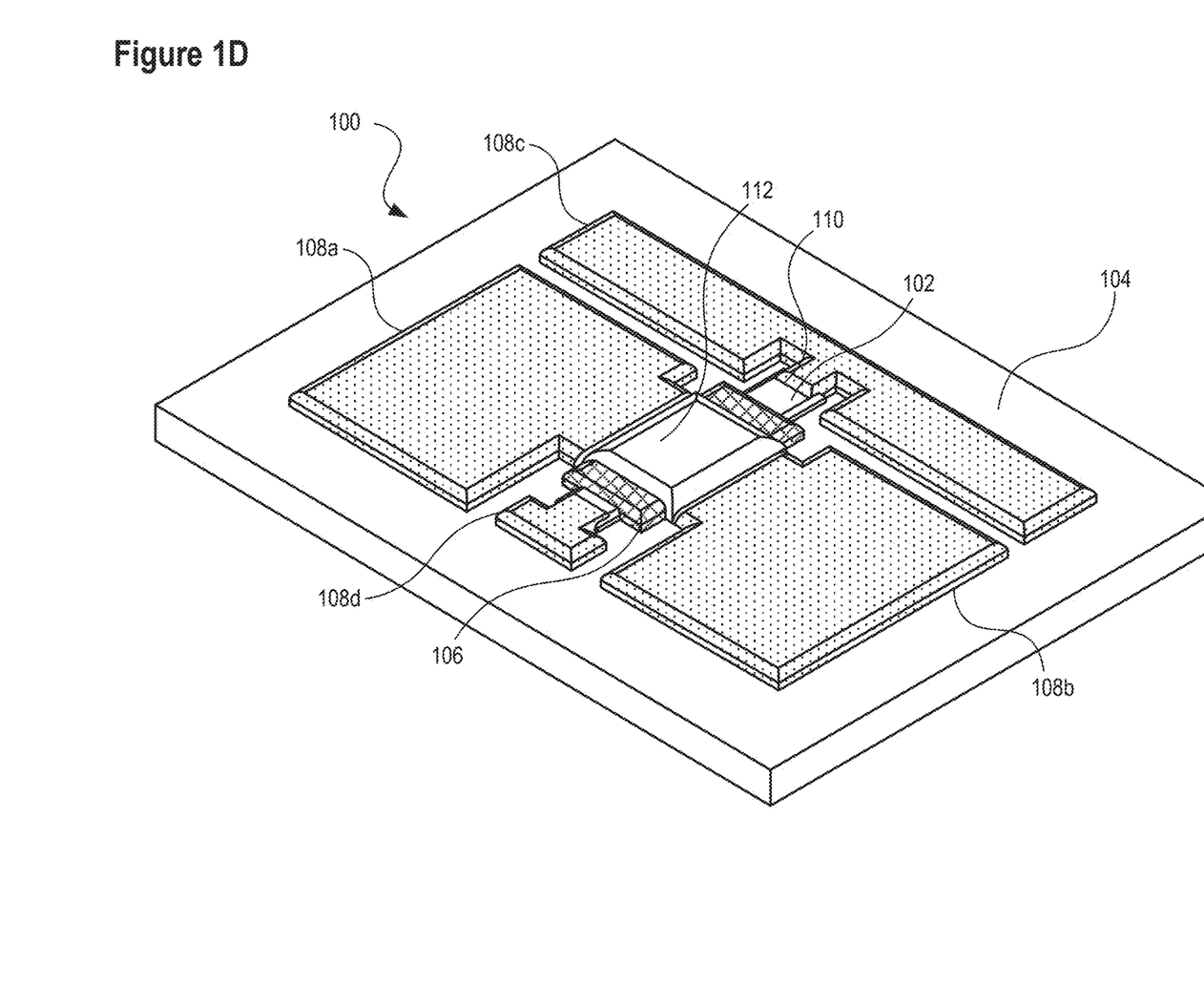
FIG. 1D illustrates a plurality of conductive components formed using a second conductive material consistent with certain embodiments of the present disclosure.

FIG. 1D illustrates a plurality of conductive components 108a-d formed using a second conductive material consistent with certain embodiments of the present disclosure. In the illustrated embodiment, conductive components 108a and 108b are in electrical communication via conductive component 112. In other words, an electrical current may be transmitted from conductive component 108a to conductive component 112 and to conductive component 108b. Similarly, conductive components 108c and 108d are in electrical communication via conductive component 102. In contrast, the dielectric layer 106 electrically separates conductive components 108a, 108b from conductive components 108c, 108d.

In the embodiment illustrated in FIG. 1D, the conductive components disposed above and below the dielectric layer 106 are formed using the first conductive element. Certain conductive elements that may be used in various embodiments consistent with the present disclosure may vary in the ability to adequately couple to the dielectric layer 106. Accordingly, in certain embodiments all conductive elements in a multi-level circuit that are in contact with a dielectric may be formed using the same conductive element.

Figure 1E:
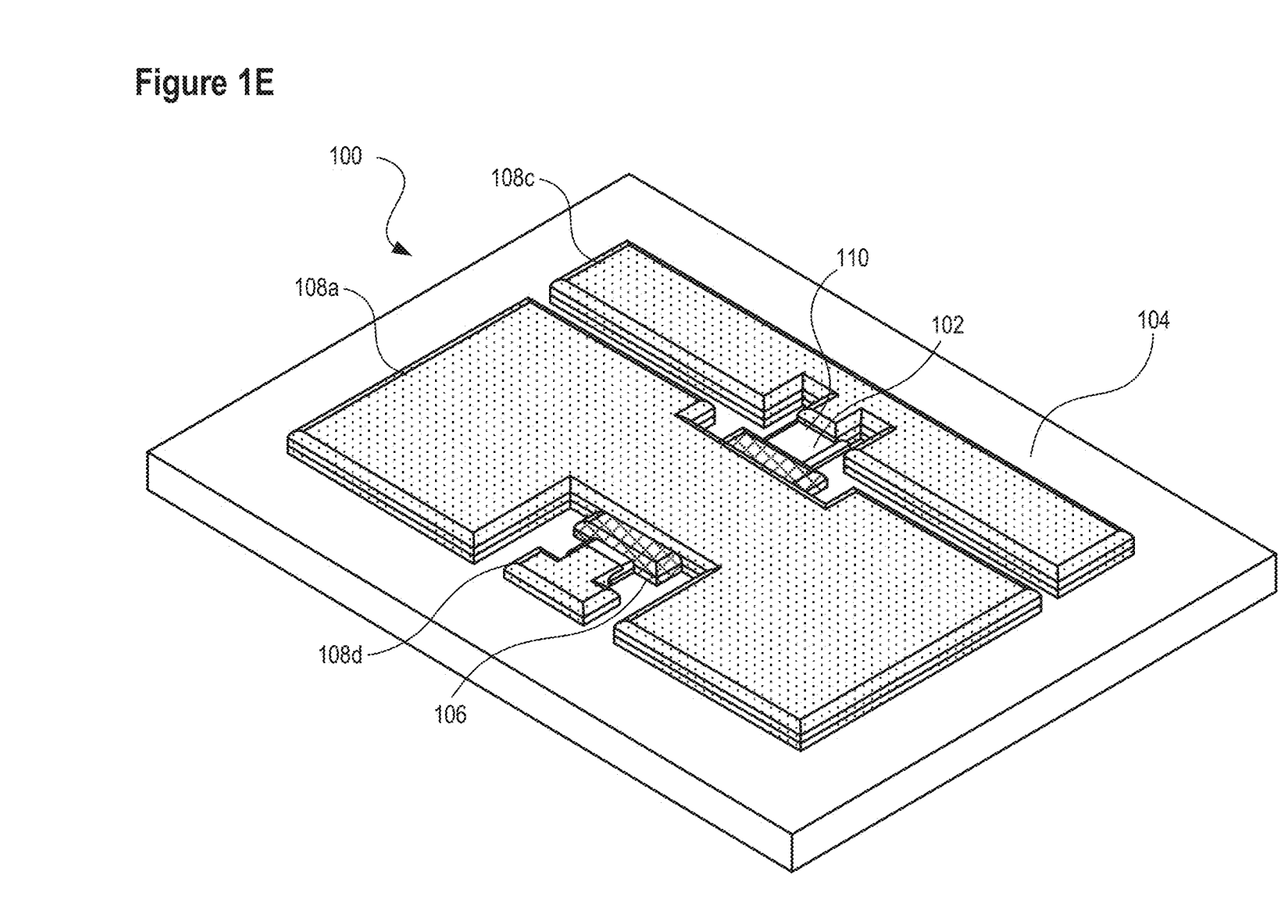
FIG. 1E illustrates an alternative embodiment of a circuit that represents an alternative embodiment to the circuit illustrated in FIG. 1C and FIG. 1D in which a plurality of conductive components formed using the second conductive element are disposed at least partially on top of the dielectric layer consistent with certain embodiments of the present disclosure.

FIG. 1E illustrates an alternative embodiment of a circuit that represents an alternative embodiment to the circuit illustrated in FIG. 1C and FIG. 1D in which a plurality of conductive components formed using the second conductive element are disposed at least partially on top of the dielectric layer consistent with certain embodiments of the present disclosure. In FIG. 1E, conductive components 108a-108c are formed using a second conductive element. Although conductive components 108a, 108b, and 108c are described in connection with the illustrated embodiment as being formed in a second conductive layer, in alternative embodiments, these conductive elements could be formed in different layers and/or in different steps in a process used to produce circuit 100. Returning to a discussion of the illustrated embodiment, conductive element 108a is disposed partially on top of the dielectric layer 106, and the dielectric layer 106 separates the first conductive component 102 from conductive element 108a. In contrast, the first conductive component 102 provides an electrical path between conductive elements 108d and 108b.

The second conductive layer 108 may be formed using a different conductive element than the conductive element that forms the first conductive component 102. In one specific embodiment, the first conductive component 102 may use silver as the conductive element, while the second conductive layer 108 may use copper as the conductive element. At the interface 110 between the first conductive component 102 and the second conductive layer 108, the copper of the second conductive layer 108 may be in direct physical connect with the silver of the first conductive element 102. The direct physical contact between the silver and the copper may create an electrical path between the first conductive component 102 and the second conductive layer 108.

One or more of the following formulations may be used as a thick film conductive ink formulation for forming a conductive layer in which copper is the conductive element. The examples are provided for illustration purposes only and are not meant to limit the various embodiments of the thick film conductive inks in any way. All materials are set forth in weight percent.

Example Formulation 1 (Theoretical Yield)

| Ingredient | Wt. % |
| --- | --- |
| Inorganic Portion | |
| Cu powder - (Base*, #1**, #2***, or #3****) | 50 to 85 (e.g., about 68) |
| CuO | 3 to 23 (e.g., about 7.69) |
| Elemental B | 0.5 to 5 (e.g., about 1.15) |
| Organic Portion | |
| Texanol ™ | 8 to 25 (e.g., about 19.62) |
| Butyl Diglyme | 1 to 4 (e.g., about 2.31) |
| Ethyl Cellulose | 0.5 to 3 (e.g., 1.15) |
| Total | 100.0 |

*Cu powder (Base) - deagglomerated coated fine particles; surface area of from about 0.4 to about 0.75 m²/g such as less than about 0.64 m²/g; median particle size of from about 4.5 to about 10.5 μm such as less than about 6.65 μm.
**Cu powder (Option #1) - submicron crystalline particles; surface area of from about 1.5 to about 2.5 m²/g such as less than about 1.85 m²/g; median particle size of from about 0.5 to about 0.9 μm such as less than about 0.65 μm.
***Cu powder (Option #2) - mono-dispersed particles; surface area of from about 0.3 to about 0.8 m²/g such as less than about 0.5 m²/g; median particle size of from about 0.01 to about 2 μm such as less than about 2 μm.
****Cu powder (Option #3) - surface area of from about 0.8 to about 1.5 m²/g such as less than about 1 m²/g; median particle size of from about 1 to about 2 μm such as about 1.5 μm.

Example Formulation 2 (Theoretical Yield)

| Ingredient | Wt. % |
| --- | --- |
| Inorganic Portion | |
| Cu powder (Base*) | 25 to 50 (e.g., 38) |
| Cu powder #3**** | 25 to 50 (e.g., 38) |
| CuO | 3 to 23 (e.g., about 4.9) |
| Elemental B | 0.5 to 5 (e.g., about 1.2) |
| Organic Portion | 10 to 30 (e.g., about 17.9) |
| Total | 100.0 |

Example Formulation 3 (Theoretical Yield)

| Ingredient | Wt. % |
| --- | --- |
| Inorganic Portion | |
| Cu powder (Base*) | 40 to 65 (e.g., 58.2) |
| Cu powder #2*** | 10 to 20 (e.g., 14.7) |
| CuO | 3 to 23 (e.g., about 8.2) |
| Elemental B | 0.5 to 5 (e.g., about 1.3) |
| Organic Portion | 10 to 30 (e.g., about 17.6) |
| Total | 100.0 |

Example Formulation 4 (Theoretical Yield)

| Ingredient | Wt. % |
| --- | --- |
| Inorganic Portion | |
| Cu powder (Base*) | 45 to 65 (e.g., 53.9) |
| Cu powder #1** | 5 to 20 (e.g., 9.8) |
| CuO | 3 to 23 (e.g., about 15.2) |
| Elemental B | 0.5 to 5 (e.g., about 3.1) |
| Organic Portion | 10 to 30 (e.g., about 18) |
| Total | 100.0 |

Figure 2:
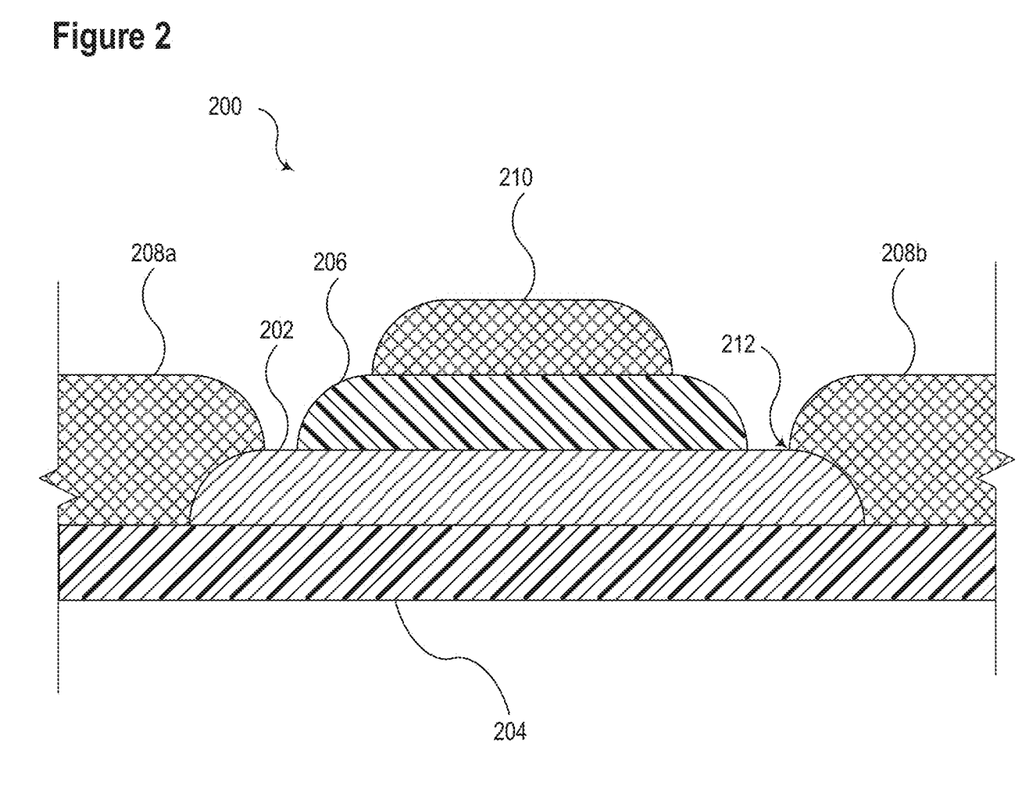
FIG. 2 illustrates a conceptual view of a cross-section of a multi-layer thick film circuit in which conductive components are in electrical communication using a conductive component, which is formed using a different conductive element than conductive components, consistent with embodiments of the present disclosure.

FIG. 2 illustrates a conceptual view of a cross-section of a multi-layer thick film circuit 200 in which conductive components 208a and 208b are in electrical communication using a conductive component 202, which is formed using a different conductive element than conductive components 208a and 208b, consistent with embodiments of the present disclosure. A substrate 204 underlies circuit 200. According to some embodiments, the substrate 204 may comprise alumina. A dielectric layer 206 may electrically separate conductive component 202 from another conductive component 210.

An interface 212 between conductive component 208b and conductive component 202 may comprise an area in which conductive component 208b overlays conductive component 202. The physical contact between conductive component 208b and conductive component 202 may create an electrical path through which electrical and/or thermal energy may flow.

Figure 3:
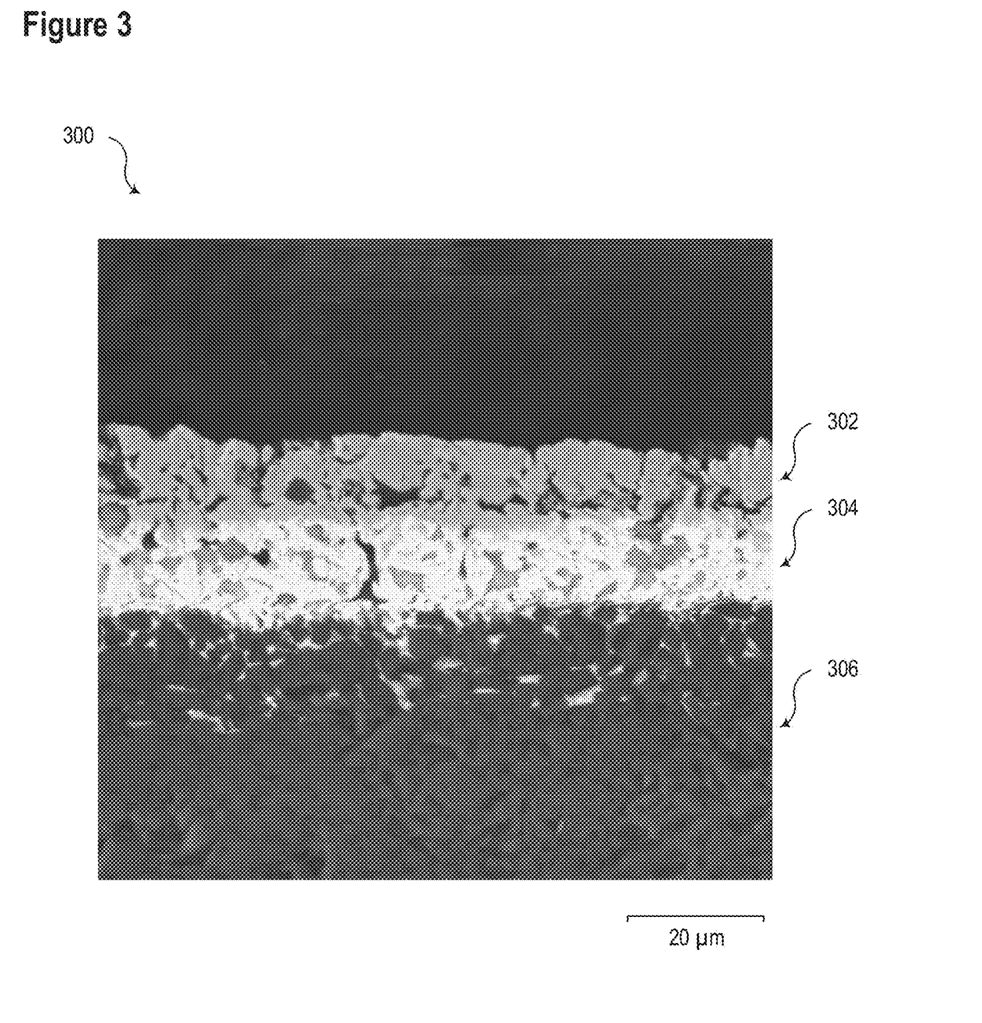
FIG. 3 illustrates a photograph of a cross-section of a multi-layer thick film circuit in which a first conductive layer formed using silver is in electrical communication with a second conductive layer formed using copper consistent with certain embodiments of the present disclosure.

FIG. 3 illustrates a photograph 300 of a cross-section of an exemplary multi-layer thick film circuit in which a first conductive layer 304 formed of silver is in electrical communication with a second conductive layer 302 formed of copper consistent with one embodiment of the present disclosure. The photograph illustrates a magnification factor of 3500. The first conductive layer 304 may be deposited on a substrate 306. As illustrated, the second conductive layer 302 formed of copper is deposited directly on top of the first conductive layer 304 formed of silver.

A first firing process may be used to fix the first conductive layer 304 permanently on the substrate 306. The first firing processes may sinter or fuse the inorganic constituents to bond the printed film to the substrate. The presence of an oxidizing atmosphere (i.e., air) during a first firing process may promote the sintering and bonding processes between the substrate 306 and the first conductive layer 304. In one specific embodiment, the first firing process may be performed at a temperature of approximately 850° C.

A second firing process may be used to fix the second conductive layer 302 on the first conductive layer 304. The second firing process may be performed in an inert atmosphere. The second firing process may be performed at a lower temperature than the first firing process to reduce leaching of the first conductive layer 304. In one specific embodiment, the second firing process may be performed at a temperature of between 600° C. and 700° C.

Figure 4:
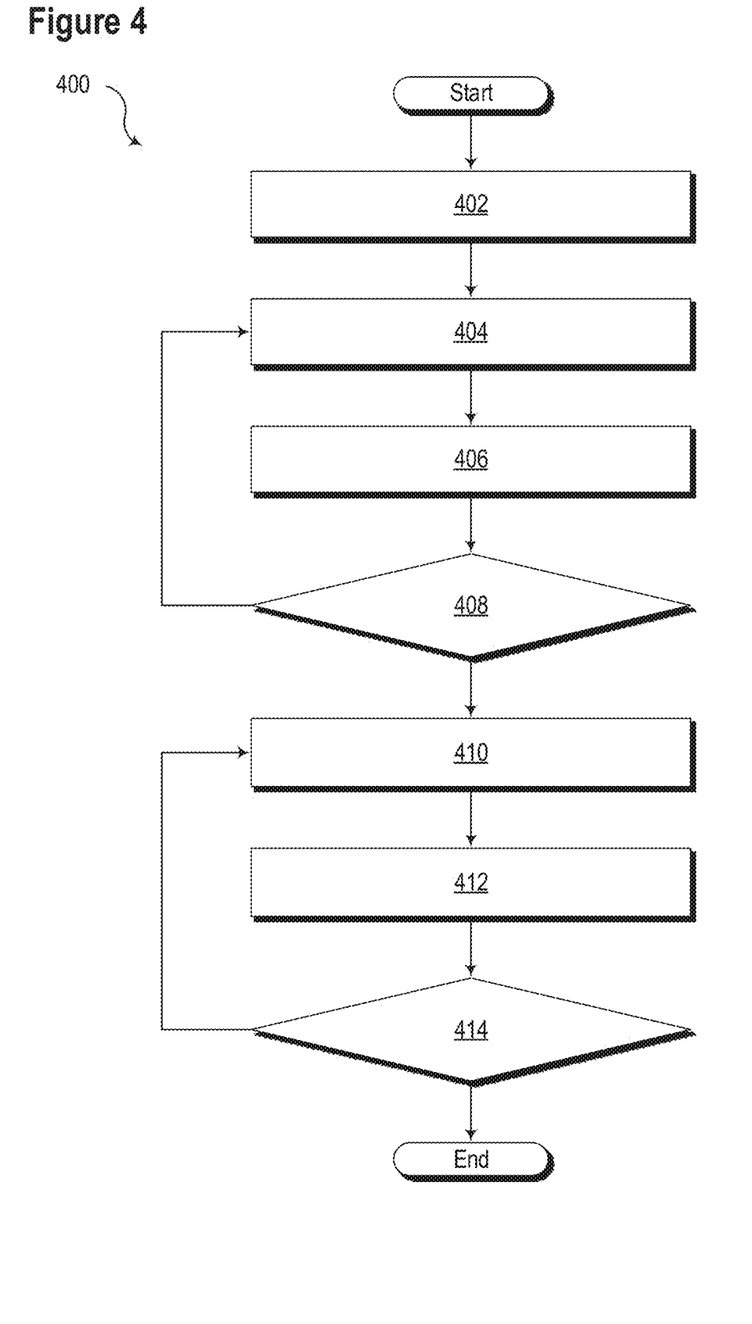
FIG. 4 illustrates a flow chart of a method of forming a thick film circuit having multiple conductive layers formed using different conductive materials consistent with certain embodiments of the present disclosure.

FIG. 4 illustrates a flow chart of a method 400 of forming a thick film circuit having multiple conductive layers formed of different conductive materials consistent with one embodiment of the present disclosure. At 402, a substrate may be prepared for use in connection with a hybrid circuit. Such preparations may include, but are not limited to scribing, profiling, drilling, dicing, etc. At 404, a layer of the thick film circuit with one or more conductive component may be formed using a first conductive element. In addition to including one or more conductive components, the layer may also include a variety of electrical components (e.g., resistors, capacitors, integrated circuits, etc.) and electrically insulating components. In certain embodiments, the first conductive element may include one or more precious metals (e.g., gold, silver, platinum, etc.).

The thick film circuit, including the layer formed at 404, may be fired in a first atmosphere at 406. In various embodiments, the first atmosphere may include oxygen. The firing in the first atmosphere may be suited for firing conductive elements including precious metals (e.g., silver, gold, silver, platinum, etc.) on a substrate. A firing temperature may be used that is appropriate for the materials. In one example in which the conductive element is silver, the firing process may be performed at approximately 850° C.±20° C.

At 408, it may be determined whether an additional layer using the first conductive element should be formed. If an additional layer is to be formed, method 400 may return to 404. If an additional layer is not formed, method 400 may progress to 410. As described above, an electrically insulating component, such as a dielectric layer, may be formed on top of electrically conductive components formed of precious metals. As also described above, difficulties may be associated with the formation of an electrically insulating component, such as a dielectric layer, on top of a layer formed of base materials.

The transition between forming elements of the thick film circuit using the first conductive element and the second conductive element may be determined, in certain embodiments by the placement of insulators in the thick film circuit. As described above, an electrically insulating component, such as a dielectric layer, may be formed on top of electrically conductive components formed of precious metals. As also described above, difficulties may be associated with the formation of an electrically insulating component, such as a dielectric layer, on top of a layer formed of base materials. Accordingly, in one embodiment, each layer disposed below an uppermost dielectric material may be formed using the first conductive element and each layer disposed below the uppermost dielectric material may be formed using the second conductive element.

At 410, a layer with a conductive component may be formed using a second conductive element. In addition to including one or more conductive components, the layer may also include a variety of electrical components (e.g., resistors, capacitors, integrated circuits, etc.) and electrically insulating components. The second conductive element may in certain embodiments be a base metal.

The thick film circuit, including the layer formed at 410, may be fired in a second atmosphere at 412. In various embodiments, the second atmosphere may be inert. The firing in the first atmosphere may be suited for firing conductive elements including base metals, such as copper. A firing temperature may be used that is appropriate for the second conductive element. In one example in which the conductive element is copper, the firing process may be performed at between approximately 600° C. and 700° C.±10° C.

At 414, it may be determined whether an additional layer using the second conductive element should be formed. If an additional layer is to be formed, method 400 may return to 410. If an additional layer is not formed, method 400 may end.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A method of forming a multi-level thick film circuit, comprising:
    forming a first layer disposed on a substrate, the first layer comprising a first conductive component formed of a first conductive element, the first conductive element comprising a precious metal;
    firing the substrate and the first layer in a first atmosphere during a first firing process, the first atmosphere comprising oxygen;
    forming a second layer comprising a second conductive component formed of a second conductive element, the second layer conductive element comprising a base metal; and
    firing the substrate, the first layer, and the second layer in a second atmosphere during a second firing process, the second atmosphere comprising an inert atmosphere;
    wherein the second layer is at least partially disposed directly on top of the first layer and the first layer is in electrical communication with the second layer.

2. The method of claim 1, wherein the first conductive element comprises silver.

3. The method of claim 1, wherein, wherein the second conductive element comprises copper.

4. The method of claim 1, further comprising:
    forming a dielectric layer to electrically separate a third conductive component from one of the first conductive component and the second conductive component.

5. The method of claim 1, wherein the first firing process is performed at approximately 850° C.±20° C.

6. The method of claim 1, wherein the second firing process is performed between approximately 600° C. and 700° C.±10° C.

7. The method of claim 1, further comprising:
forming a plurality of additional layers; and
forming a plurality of dielectric layers configured to electrically separate at least a portion of the plurality of additional layers;
wherein each layer disposed below an uppermost dielectric layer is formed using the first conductive element and each layer disposed above the uppermost dielectric material is formed using the second conductive element.

8. The method of claim 1, further comprising:
forming a plurality of additional layers comprising a plurality of conductive components; and
forming a plurality of dielectric layers configured to electrically separate at least one of the plurality of conductive components from at least one other of the plurality of conductive components;
wherein each conductive component disposed directly in contact with any of the plurality of dielectric layers is formed using the first conductive element.

9. The method of claim 1, wherein forming the second layer comprises:
applying a thick film ink to the multi-level thick film circuit, the thick film ink comprising:
an organic portion; and
an inorganic portion dispersed in the organic portion defining a paste,
wherein the inorganic portion comprises metallic copper powder, cupric oxide, and elemental boron.

10. A method of forming a multi-level thick film circuit, comprising:
forming a first layer disposed on a substrate, the first layer comprising a first conductive component formed of a first conductive element, the first conductive element comprising a precious metal;
firing the substrate and the first layer in a first atmosphere at a first temperature during a first firing process;
forming a second layer comprising a second conductive component formed of a second conductive element, the second layer conductive element comprising a base metal; and
firing the substrate, the first layer, and the second layer in a second atmosphere at a second temperature during a second firing process, the first temperature being greater than the second temperature;
wherein the second layer is at least partially disposed directly on top of the first layer and the first layer is in electrical communication with the second layer.

11. The method of claim 10, wherein the first atmosphere comprises oxygen.

12. The method of claim 10, wherein the second atmosphere comprises an inert atmosphere.

13. The method of claim 10, wherein the first firing process is performed at approximately 850° C.±20° C.

14. The method of claim 10, wherein the second firing process is performed between approximately 600° C. and 700° C.±10° C.

\* \* \* \* \*